United States Patent [19]

Wilson

[11] Patent Number: 4,709,468

[45] Date of Patent: Dec. 1, 1987

[54] METHOD FOR PRODUCING AN INTEGRATED CIRCUIT PRODUCT HAVING A POLYIMIDE FILM INTERCONNECTION STRUCTURE

[75] Inventor: Arthur M. Wilson, Richardson, Tex.

[73] Assignee: Texas Instruments Incorporated, Dallas, Tex.

[21] Appl. No.: 824,403

[22] Filed: Jan. 31, 1986

[51] Int. Cl.⁴ .................... H01L 21/28; H01L 21/283
[52] U.S. Cl. ...................................... 437/209; 357/75; 437/205
[58] Field of Search ................ 29/589, 831, 834, 842, 29/577 C, 577 R, 576 C; 156/273.3, 275.5; 357/71, 75, 80; 427/97, 103, 96

[56] References Cited

U.S. PATENT DOCUMENTS

| | | | |
|---|---|---|---|
| 3,736,475 | 5/1973 | Berner | 317/234 R |
| 3,801,880 | 4/1974 | Harada et al. | 317/234 |
| 3,868,724 | 2/1975 | Perrino | 317/234 |
| 3,869,787 | 3/1975 | Umbaugh | 29/577 |
| 3,912,852 | 10/1975 | Simon | 174/68.5 |
| 3,978,516 | 8/1976 | Noe | 357/70 |
| 4,040,083 | 8/1977 | Saiki et al. | 357/54 |
| 4,063,993 | 12/1977 | Burns | 156/659 |
| 4,081,898 | 4/1978 | Taylor, Jr. et al. | 29/622 |
| 4,208,257 | 6/1980 | Hom-ma et al. | 204/129.65 |
| 4,209,355 | 6/1980 | Burns | 156/630 |
| 4,250,520 | 2/1981 | Denlinger | 357/68 |
| 4,331,740 | 5/1982 | Burns | 428/572 |
| 4,369,090 | 1/1983 | Wilson et al. | 156/644 |
| 4,472,876 | 9/1984 | Nelson | 29/840 |
| 4,587,719 | 5/1986 | Barth | 29/577 C |

FOREIGN PATENT DOCUMENTS 0162448 10/1982 Japan ................. 29/577 C

OTHER PUBLICATIONS

Gessner G. Hawley, "The Condensed Chemical Dictionary", Van Nostrand Reinhold Co., 1977, pp. 493–494.
B. J. Donlan et al., "The Wafer Transmission Module", VLSI Systems Design, Jan. 1986, pp. 54 et seq.

Primary Examiner—Brian E. Hearn
Assistant Examiner—Tom Thomas
Attorney, Agent, or Firm—Leo N. Heiting; N. Rhys Merrett; Melvin Sharp

[57] ABSTRACT

A method for making integrated circuits in which a polyimide/conductor multilevel film is cast on a substrate, using available or existing semiconductor processing equipment. The polyimide film is formed from readily available polyamic acid resins, and the conductor can be sputtered aluminum formed to interconnection conductor patterns by standard photolithographic techniques. After fabrication of the multilayer film, the conductors of the film and the device circuit are brought into aligned contact, and the device circuit affixed to the film. The film and the device are then removed from the substrate for further processing, such as bonding the device and film to a mother board or leadframe, as desired.

18 Claims, 5 Drawing Figures

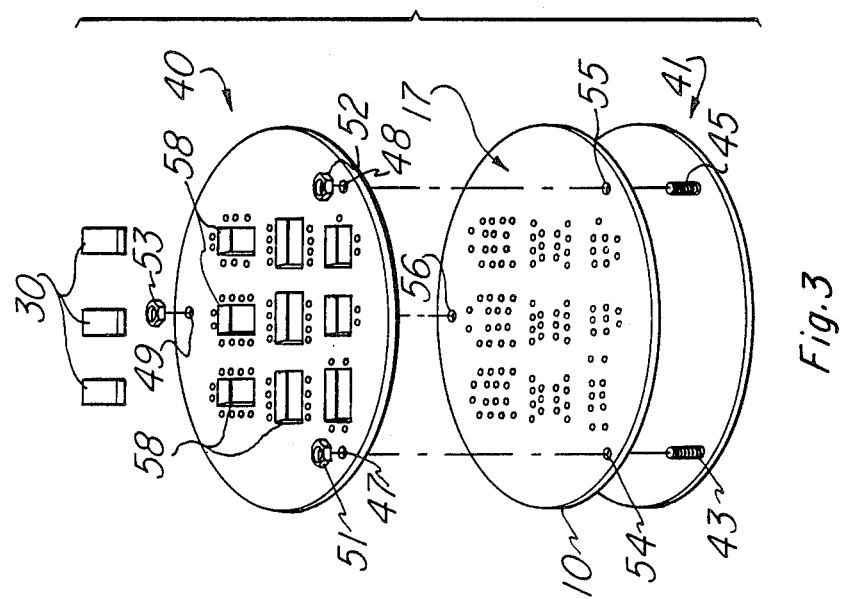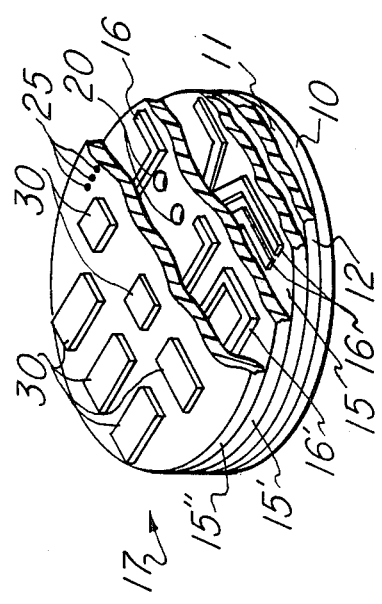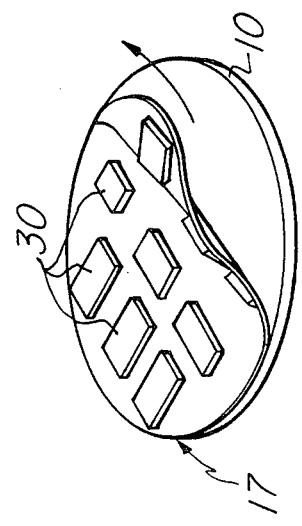

METHOD FOR PRODUCING AN INTEGRATED CIRCUIT PRODUCT HAVING A POLYIMIDE FILM INTERCONNECTION STRUCTURE

BACKGROUND OF THE INVENTION

1. Field of the Invention

This invention relates to improvements in semiconductor integrated circuit interconnection methods and products, and, more particularly, to improvements in the manufacture of integrated circuit chips employing flexible, a multilevel interconnection film and the product made by the method.

2. Description of Related Art Including Information Disclosed Under §§1.97–1.99

In the past, there have been numerous techniques advanced to increase the density of integrated circuits. Among those proposed have been various interconnection schemes involving modifications to printed circuit boards, thick film hybrid circuits, flexible circuits and multilayer interconnection structures on semiconductor integrated circuits themselves.

For example, in the printed circuit board technology, single and double sided boards have been made by evaporating copper or other conductive material in a desired pattern onto a board of dielectric material, such as fiberglass, epoxy, or some combination of these or similar materials. Copper sheets have also been laminated for instance, with an appropriate heat curable adhesive, onto boards, followed by patterning the conductive leads by photoresist masking and etching techniques enabling individual component leads to be placed in through holes and wave soldered in place.

Multilayer boards have also been proposed for more complex routing of the interconnection leads, such boards being fabricated, for instance, by stacking individual boards having patterned leads and affixing them by applying and curing a heat curable adhesive to form a single laminate.

In the fabrication of thick film hybrid circuits a conductive ink is silk screened onto a ceramic substrate. The ink is converted to a metallic form by firing the inked substrate in a high temperature oven. The components are placed, held in place by a high temperature solder which is inked onto the pad areas, and which has an adhesive nature at lower temperatures. These cicuits are generally designed for use at higher temperature environments, and usually, the components are not pre-packaged to protect them from moisture and other adverse chemical environments; consequently, they are often encapsulated in a hermetic package with gold plated leads for interconnection to the next level of assembly. These circuits often are prohibitively expensive.

In multilayer interconnection structures which have been used on semiconductor integrated circuits, sometimes a polyamic acid resin is spun onto a semiconductor substrate containing one or more semiconductor devices to create, after a cure cycle, a polyimide dielectric insulator. By successive coating and patterning of a metal lead level and a polyimide level with appropriate vias, it is possible to construct two or more levels of metal interconnection on integrated circuits. The interconnection provides more flexibility in connecting transistors, diodes, resistors, and other components in the semiconductor layer of the circuit, enabling higher densities to be obtained in monolithic integrated circuits. This technology forms the backbone for the manufacture of wafercast multilevel interconnection films, and is well documented in the patents of S. Harada et al., U.S. Pat. No. 3,801,880, entitled "Multilayer Interconnected Structure for Semiconductor Integrated Circuit and Process for Manufacturing the Same", and in U.S. Pat. No. 4,040,083, entitled "Aluminum Oxide Layers Bonding Polymer Resin Layer to Semiconductor Device". Reference also made to U.S. Pat. No. 4,369,090 by the applicant hereof entitled "Process for Etching Sloped Vias in Polyimide Insulators", said application being assigned to the assignee hereof and incorporated herein by reference.

SUMMARY OF THE INVENTION

In light of the above, it is an object of the invention to provide a method to achieve high density interconnection of integrated circuits.

It is another object of the invention to provide a high density interconnection method of the type described which can be used in packaging LSI devices with discrete electronic components.

It is another object of the invention to provide a high density interconnection method and novel product made by the method which can be used in automatically assembling and bonding LSI devices to a daughter film connector or for gang bonding the daughter film to a mother board or leadframe.

These and other objects, features and advantages will become apparent to those skilled in the art from the following detailed description when read in conjunction with the accompanying drawing and appended claims.

In accordance with a broad aspect of the invention, a multilayer polyimide and conductor film is constructed by a casting process on, for example, on a polished, oxidized, circular silicon or quartz substrate. In a preferred embodiment, the substrate is silicon with the <100> plane oriented parallel to the surface of the substrate. A layer of $SiO_2$ is formed over the surface of the substrate, and alternate layers of polyamic acid resin and conductor are sequentially formed onto the $SiO_2$, the conductor layers, for example, being formed by sputtering and patterning aluminum by conventional photolithographic techniques, and the polyamic acid resin layers being constructed by a wafercast method.

As the multilayer film is being fabricated, the successive layers of polyamic acid resin are partially cured to resist photolithographic processing chemicals and substances, and yet to still be capable of adhering to subsequently formed polyamic resin layers, and to enable vias to be formed in the partially cured intermediate polyamic acid resin layers through which interconnections between the various conductor levels is to be established.

After the formation of the film has been completed, it is cured in a final cure process at 450° C. in an inert atmosphere to completely convert the polyamic acid resin to a polyimide film and to anneal the micropolymer structure. Integrated circuit chips are then soldered to the conductors of the film, and the entire assembly is then removed from the substrate by subjecting the film assembly and substrate to an appropriate chemical swelling agent.

In one embodiment a metal template and backing plate are provided, the backing plate having alignment pins to mate with corresponding alignment holes in the template and the substrate. In addition, alignment holes are provided in the template to receive device circuits or chips to establish and maintain their alignment on the film prior to the connection of the device circuits to the conductors of the film. The film, template, and device circuit are brought into aligned contact, and the device circuits are affixed to the film, after which the device and film is removed from the substrate. The device and film can then be bonded to a mother board or leadframe, as desired.

As will become apparent, the invention offers many technical advantages over the prior art. More particularly, the invention enables the fabrication or building of an interconnection film using available or existing wafer processing equipment without substantial modification. Moreover, the invention uses readily available polyamic acid resins, solvents and sputtered aluminum. It will be appreciated that the invention envisions substrate sizes of from 4" to 16", or more, in diameter to provide increased manufacturing capacity.

BRIEF DESCRIPTION OF THE DRAWING

The invention is illustrated in the accompanying drawing, in which:

FIG. 1 is a perspective view of a polyimide conductor film with portions of the various film layers partially cut away, fabricated on a silicon substrate, in accordance with the method of the invention.

FIG. 2 is a perspective view of the film and substrate of FIG. 1 showing the removal of the film from the substrate on which it has been formed, in accordance with the invention.

FIG. 3 is a perspective view of an apparatus for aligning integrated circuits in the fabrication of the film structure, in accordance with the invention.

Figure 4:
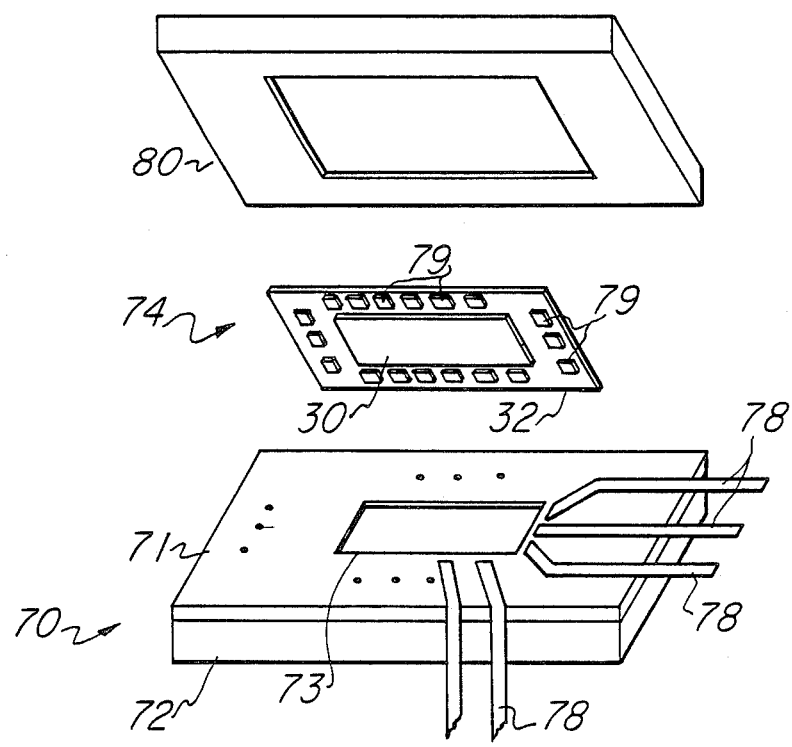
FIG. 4 is a perspective view of a typical integrated circuit package, showing one way by which an integrated circuit chip mounted to a flexible interconnection film in accordance with the method of the invention can be attached.

In the various figures of the drawing, like reference numerals are used to denote like or similar parts. In addition, various sizes and dimensions of the parts have been exaggerated or distorted for clarity of illustration and ease of description. It will be further appreciated that the structures of the figures have been greatly simplified for ease of illustration; for instance, the interconnection structures may be of much greater complexity than shown due to the extremely large number and density of connection leads required in typical integrated or LSI circuit fabrication applications.

DETAILED DESCRIPTION OF THE PREFERRED EMBODIMENTS

The method in accordance with a preferred embodiment of the invention provides a method for fabricating a multilevel conductor and polyimide film integrated circuit interconnection structure or film and for fabricating a high density interconnected integrated product using the film.

Thus, in accordance with a preferred embodiment of the invention, with reference now to FIG. 1, a circular casting substrate 10 is provided on which a multilayer polyimide and patterned conductor film, described below in detail, is built up stepwise by a casting process.

The substrate 10, can be of any material which will support the interconnection film to be constructed, and preferably is of a material which enables conventional semiconductor wafer fabrication equipment to be used in the formation of the polyamic acid and conductor layers, for example, silicon or quartz. Other substrate materials will be apparent to those skilled in the art. Thus, in a preferred embodiment of the invention, the substrate 10 is an oxidized, polished circular wafer or substrate of silicon, with the <100> plane oriented parallel to the surface 11 of the substrate. (As will become apparent, the purpose for the <100> orientation is to enable alignment holes to be formed in the substrate by an orientation direction dependent etch.) It will be appreciated that the substrate size can be of virtually any size which can be conveniently handled, for instance, 4" to 16", or more, in diameter to provide suitable manufacturing capacity.

In the event that the substrate is of silicon, as above mentioned, a layer of $SiO_2$ 12 can be formed over the surface of the substrate 10, as shown, and to which a layer of polyamic acid resin is applied. The layer of $SiO_2$ 12 serves to provide a surface to which the polyamic acid resin can adhere during the fabrication of the multilayer film, herein described, yet which will allow the film to be easily removed upon completion of the processing steps. It will be appreciated that depending upon the materials used in the fabrication of the films, other coating materials can be selected which will be of equal advantage for this purpose, in consideration of the materials used, as mentioned.

With the substrate 12 and layer of $SiO_2$ 12 so configured, alternate layers of polyamic acid resins 15, 15', 15", etc., and conductor 16 and 16', etc., and are then sequentially formed onto it. The conductor layers 16 and 16', for example can be formed by sputtering aluminum, patterned, for instance by conventional photolithographic materials and equipment (not shown). The conductors layers 16 and 16', and the polymer acid resins 15, 15', 15", therefore form a multilayer film 17 for device interconnection, as below described in detail. As mentioned the polyamic acid resin, on the other hand, is constructed of and is preferably fabricated by a wafercast method. (It will be appreciated that other casting techniques such as wire mesh screening, doctor blading or spraying may be used to obtain thicker films, if necessary or desired. For example, although a 4 micron thick film of PIQ-13 has been produced by spinning, other thickness can be readily accomplished by other well known techniques, as needed for a particular application.)

The particular polyamic acid resin used can be selected from the class of polyamic acid resins known in the art which has good self adhesion, good adhesion to the conductors used in forming the conductor patterns, and good patternability. Good patternability, as used herein, denotes that the material is selectively soluble by partial curing, such as "b-stage" curing described in my U.S. Pat. No. 4,369,090, that vias can be formed in the material, and that photoresist strippers used in processing the structure during its fabrication are resisted. It has been found, for example, that polyamic acid resins are available under the trademarks PYRALIN and PIQ-13 of respectively Dupont and Hitachi chemical companies are particularly well suited of the film.

With respect to the conductor materials which are suitable in practicing the method of the invention, although prototypes have been built using PIQ-13 and evaporated aluminum, a large number of conductors may be used in the fabrication of the multilayered structure. More particularly, the particular conductors which can be used include those conductors which have good adherence to the particular polyamic acid resin or other film material used. It will be appreciated, however, that since multilevel conductor patterns are enabled, various types of conductors can be simultaneously used in single film. In fact, it may be possible, as will become apparent, to produce "encapsulated" conductors, or it may be possible to use semiconductor materials or insulating materials as the conductors.

Thus, in the fabrication of the film, a first layer of polyamic acid resin 15 is fabricated on the $SiO_2$ layer 12, and partially cured to a "b-stage", so as to be enabled to resist processing chemicals and substances in the subsequent conductor patterning, by photolithographic techniques or the like, yet still being enabled to be adhered to by subsequently formed polyamic acid resin layers. The partial cure of the polyamic acid resin layer, for example, can be accomplished by subjecting the layer to a temperature of between about 140° C. to 250° C., or so, for a period of about an hour.

After the first conductor pattern 16 has been applied and formed, as mentioned, by standard photolithographic techniques or other methods, a second layer 15' of polyamic acid resin is applied and partially cured to encapsulate the conductors 16 between the two layers 15 and 15' of the polyamic acid resin. Additional conductor pattern 16', as needed, can be formed over the previously formed polyamic acid resin layers, as will be apparent to those skilled in the art. Vias 20 can be formed in the partially cured intermediate polyamic acid resin layers, such as the second layer 15', by known techniques, such as the method described in the above mentioned U.S. Pat. No. 4,369,090, through which interconnections between the various conductor levels is established.

After the formation of the film 17 has been completed, it is cured in a final cure process at 450° C. in an inert atmosphere. This completely converts the polyamic acid resin of the layers 16 and 16' to a polyimide film and anneals the micropolymer structure.

After the multilevel film 17 has been constructed on the substrate, a material, such as a trilevel metal, is deposited and patterned to create chip connection pads 25 and to seal and cap the vias 20 of the last polyamic acid resin layer 16". The top layer of the pads 25 can be gold or other material to which connection can easily be established, and the pads 25 are patterned to correspond to the condition structure of the integrated circuit chips 30 to be attached to them. The connections elements of the integrated circuit chips 30, for example, can be constructed in a "bump" configuration (not shown) of suitable connection materials, such as copper with caps (not shown) of an alloying material, such as solder, gold or the like, for attachment to the pads 25 of the film 17, in a fashion similar to "flip-chip" connections known in the art. It has been found that a cap of 60-40 tin-lead solder serves as a suitable material with which to affix the chips to the conductors of the substrate. The connection pads (not shown), of the chips 30 can be constructed in a manner known in the art, as can be seen, for example, in U.S. Pat. Nos. 4,023,197 or 4,021,838. It should be also noted that The bump-pad structure serves in addition as a standoff and stress relief structure between the structures of the film 17 and chips 30 carried on it.

Thus, one or more integrated hybrid circuit chips 30, for example, can be placed on the film pattern, and the solder, or other alloying material which may be used, is heated, or otherwise activated, to its melting temperature to establish connection between the conductor leads of the film and the corresponding contacts of the chips, thereby to attach or affix the hybrid circuit chips 30 to the film 17. Surface tension of the solder (for example) may self-align circuit chips which might be slightly askew with respect to the film pads by the surface tension effects of the liquid or molten solder.

After the completion of the film 17 and attachment of the integrated circuit chips 30, the entire assembly is removed from the substrate 10 by subjecting the assembly and substrate 10 to an appropriate chemical agent which produces a swelling of the structure after complete cure of the polyamic acid resin layers to a polyimide film. It will be appreciated that using the polyamic acid resin-sputtered aluminum on silicon or quartz combination, as described, that the chemical agent can be a steam or a boiling water environment (not shown) to which the assembly can be exposed for a sufficient time, for instance 12 to 16 hours, to enable the film 17 to be peeled from the substrate 10 with the circuit components attached, as shown in FIG. 2. It will be appreciated that one of the particular advantages of the invention is that the the completely cured film can be removed from the substrate using readily available chemicals, yet requiring only a minimum peel force. It should also be noted that although water is most effective other chemical agents may be used to lower the adhesion of polyimides from a silicon oxide surface.

After the film 17 has been cured and removed from the substrate 10, it can be then cut or otherwise patterned for packaging or further handling, as needed.

To facilitate the alignment and attachment of the integrated circuit chips 30 to the film 17, if needed, a template 40 can be provided, as shown in FIG. 3. The 40 template is of a suitable material which does not join to the materials employed during the fabrication process, and can be, for example, of an alloyed metal sold under the Trademark "Kovar" consisting of 29% by weight of nickel, 17% by weight of copper and 53% by weight of iron and 1% minor ingredients. "Kovar" is made by Westinghouse Electric Corporation.

As will be apparent to those skilled in the art, other materials, such as semiconductor wafers, or the like, which have similar coefficients of thermal expansion to the underlying substrate 10 can be equally advantageously employed in the fabrication of the template 40. In the event a semiconductor material is selected for the material of the template 40, orientation direction dependent etches can be used to particular advantage to form the alignment holes for receiving the circuit elements to be attached to the film 17. A companion backing plate 41 is also provided to assure the alignment of the substrate 10, film 17 carried on the substrate 10, and template 40. The backing plate 41 contains three threaded alignment pins 43–45 to mate with the respective holes 47, 48, and 49 in the template 40 and the corresponding holes 54, 55, and 56 in the film 17 and substrate 10 formed during the fabrication process, described above.

The film 17, the substrate 10, and the alignment template 40 are placed over the backing plate 41 in alignment with the three alignment pins 43–45. Three spring loaded nuts 51, 52, and 53 are screwed onto the respective alignment pins 43–45 to clamp the assembly with sufficient force to prevent the template and substrate from separating due to vibrations while the chips 30 are affixed to the film 17, for example by being passed through a chain furnace or the like, yet with an insufficient force to not overstress the brittle silicon substrate 10. The circuit components 30 are then selected and placed in the appropriate template holes 58 in the correct orientation, aligned with the corresponding locations on the film 17 by the alignment template 40, so that the bumps or pads contact corresponding pads or bumps on the film with which it contacts.

It can be seen that in many applications the circuit components may perform unique functions, and may have different rectangular form factors. A polarizing conductor pattern may exist so that the component must be placed in a particular orientation on the film 17; that is, steps may need be taken to ensure that the chip is not placed ±90° or 180° out of phase to the correct orientation. If the multilevel film in a particular application is to be the "daughter board" in a "daughter board" to "mother board" process, a "hot shoe" solder of the edge pads of the "daughter board" bond pads may be performed so that no further component alignment is required. If the multilevel film is to be assembled in the cavity of a hermetic or plastic lead framed package (not shown), 17 mil solder coated silver balls are rolled into holes over the top of the multilevel film edge bond pads, in a manner known in the art. The entire assembly may then run through a chain furnace at an appropriate temperature to cause the solder bumps on the circuit chips and the solder on the silver balls to melt and wet the pads on the multilevel film.

It should be emphasized that in the alignment scheme of the invention, semiconductor photolithographic techniques are used to place the patterns for the alignment holes of the multilevel film substrate and the alignment holes for the pins and circuits chips on the template. With a single mask set it is possible to achieve alignment overlay of better than ±1 micron. In transferring these patterns through photomasking and electrochemical etching of the metal template and orientation dependent etching of a <100> crystallographic plane of the silicon substrate, allowance must be made for undercut in the metal and for the 54.74° angle of the slow etching <111> plane to the <100> plane in silicon. In spite of these compensation requirements it is possible to place 20 mill alignment circles in the template and 20 mil alignment squares in the multilevel film substrate with an overlay tolerance of ±1 mil. This tolerance is accurate enough in most applications to permit bonding of 5 mil solder bumps with a high yield and high productivity.

With the integrated circuit chip and interconnection film constructed as described above, and after the film is cut to separate the various individual portions of it, the resulting structure is a chip 30 carried upon a flexible interconnection film 32. This can be mounted in a standard integrated circuit package 70, for example, as shown in FIG. 4. Thus, as shown, a base including a ceramic top 71 on a copper base 72 has a cavity 73 within which the circuit chip 30 on the film structure 32 is received. A number of conductive leads 78 of material such as electroless tin or solder plate on copper provide a typical leadframe, each lead 78 having end portions extending to a location adjacent the cavity 73 for connection to the conductors of the chip-film structure 74. Thus, the chip portion of the chip-film structure 74 is located within the cavity 73, which also may be partially filled with a potting or thermal and mechanical shock absorbing material (not shown), and the connector pads 79 on the film 32 are attached or affixed to the ends of the leads 78 by soldering or other technique. The package is completed by the attacment of a ceramic or plastic cap 80.

Figure 5:
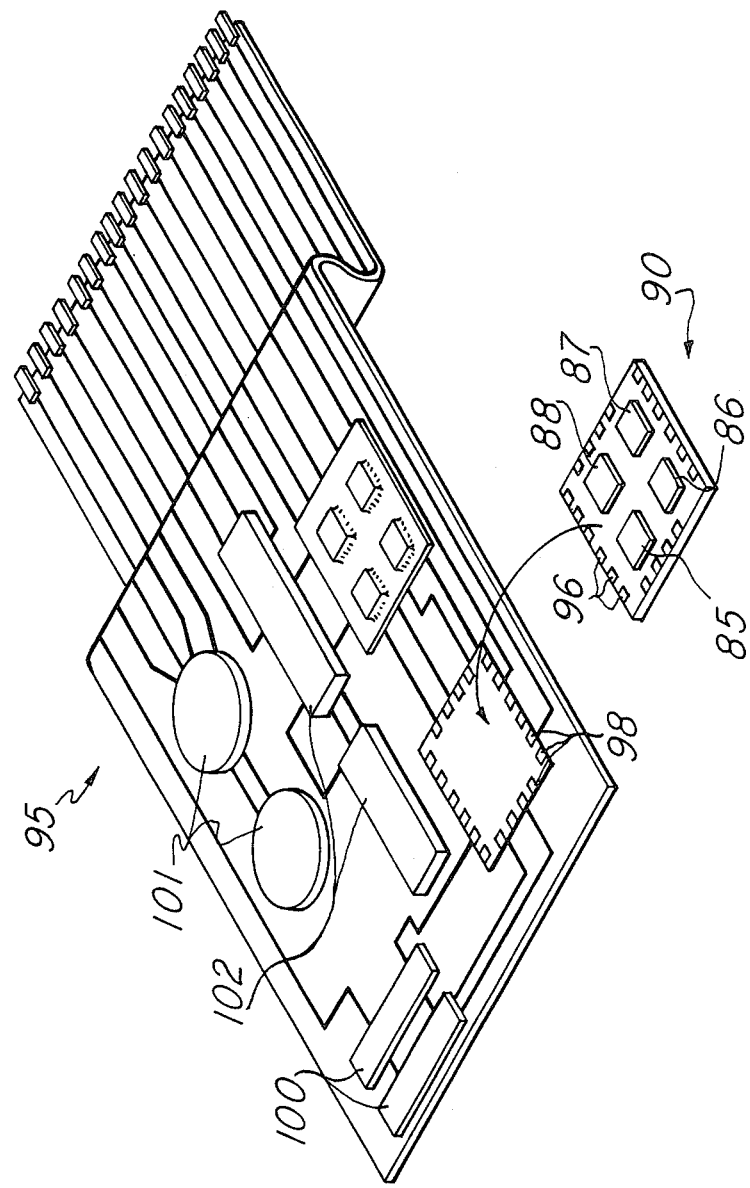
FIG. 5 is a perspective view of a "mother" film assembly to which a "daughter" chip assembly, fabricated in accordance with the method of the invention can be attached.

In another context, a number of integrated circuit chips 85–88 may be mounted on a polyimide film 89, as shown in FIG. 5, to form a "daughter film" 90. The "daughter film 90" can then be attached at a location of a "mother film" assembly 95 by attachment by soldering or the like of the pads 96 of the "daughter film" 90 to respective conductive pads 98 on the "mother film" 95. The "mother film" 85 can be, for example, a "KAPTAN" film, which is a polyimide film 1–5 mils thick made by Dupont de Nemours, E. I. & Co., on which can be carried other elements, such as resistors or passive components 100, detectors 101, displays 102, etc.

Other examples of use will be apparent to those skilled in the art. Although the invention has been described and illustrated with a certain degree of particularity, it is understood that the present disclosure has been made by way of example only and that numerous changes in the combination and arrangement of parts or steps may be resorted to by those skilled in the art without departing from the spirit and the scope of the invention as hereinafter claimed.

What is claimed is:

1. A method for making interconnected circuit elements, comprising:
   fabricating an interconnection film of alternating layers of conductor and polyamic acid resin on a substrate to receive and carry additional circuit elements,
   attaching the additional circuit elements to the film, and removing the film from the substrate.

2. The method of claim 1 wherein said step of attaching additional circuit elements comprises providing at least an integrated circuit chip and connecting leads of the chip to corresponding conductor leads of said interconnection film.

3. A method for making integrated circuits, comprising:
   forming a film of polyamic acid resin on a substrate,
   forming conductor leads on said film,
   providing contacts to said conductor leads to receive corresponding contacts of a device to which electrical connection is desired to be established,
   attaching said contacts of said device with said contacts of said film, and
   removing said film from said substrate.

4. The method for making integrated circuits in accordance of claim 3 further comprising fabricating multiple layers of polyamic acid film and conductor leads.

5. The method for making integrated circuits in accordance of claim 4 further comprising:
   providing a substrate of silicon cut with <100> plane parallel to a surface on which said film is cast; and
   forming a layer of silicon dioxide on the surface of said substrate to receive said film.

6. The method for making integrated circuits in accordance of claim 5 further comprising:
   partially curing each successive layer of polyamic acid resin to the formation of the next, and completely curing all of the layers after all have been formed.

7. A method for making an integrated circuit having a flexible interconnection film attached thereto, comprising:
providing a substrate,
casting a polyimide/conductor multilevel film on said substrate,
providing a template having holes adapted to receive an integrated circuit in alignment with corresponding locations on said substrate,
providing means for maintaining an alignment between said substrate, template, and integrated circuit,
affixing said integrated circuit to said film,
and removing said film and integrated circuit from said substrate.

8. The method of claim 7 wherein said substrate is a substrate of quartz.

9. The method of claim 7 wherein said substrate is a substrate of semiconductor material.

10. The method of claim 9 wherein said step of providing alignment means comprises the steps of:
providing a backing plate having alignment pins,
and providing said semiconductor substrate by providing a safer of silicon with its <100> plane parallel to a surface on which said film is cast,
and forming alignment holes in said substrate by an orientation dependent etch at locations corresponding to the locations of said alignment pins of said backing plate to enable said substrate to be implacable on said alignment pins of said backing plate to maintain said substrate in an aligned orientation.

11. The method of claim 10 wherein said backing plate is provided with three threaded alignment pins, and wherein said alignment holes are formed three in number.

12. The method of claim 10 further comprising providing bumps on said integrated circuit chip of conductive material, and providing corresponding connector pads on said film at locations corresponding to the locations of said bumps.

13. The method of claim 12 wherein said bumps are coated with an alloying material of 60-40 tin-lead solder.

14. A method for making integrated circuit chips having a flexible interconnection films attached thereto, comprising:
providing a substrate having alignment holes therein,
alternately applying layers of a polyamic acid resin and a conductor to said substrate to provide an interconnection film,
patterning said interconnection film to form conductor interconnection lines in said conductor layers and alignment holes and feed through vias in said polyamic amid resin layers,
curing said interconnection film to form a film of polyimide and conductor in alternating layers,
providing a metal template having holes adapted to receive at least one integrated circuit chips and alignment holes corresponding to the alignment holes in said substrate,
providing a backing plate having alignment pins to mate with said alignment holes in said template and said substrate,
bringing said film, template, at least one device circuit chip, and said backing plate into aligned contact to form an aligned structure, and applying affixing means to said structure;
affixing said film to said device circuit to create a connected circuit structure;
removing said connected circuit structure from said backing plate, and
removing said film from said substrate by exposing it to an atmosphere containing steam.

15. The method of claim 15 wherein said substrate is of quartz.

16. The method of claim 15 wherein said substrate is of semiconductor material.

17. The method of claim 17 wherein said substrate is silicon oxide coated silicon cut with <100> plane parallel to a surface on which said film is cast.

18. The method of claim 15 wherein said affixing step comprises providing an alloying material of 60-40 tin lead solder between said device circuit and said film.

* * * * *